(12) United States Patent
Cho et al.

(10) Patent No.: US 6,300,642 B1
(45) Date of Patent: Oct. 9, 2001

(54) METHOD FOR MONITORING FARADAY CUP OPERATION IN AN ION IMPLANTATION APPARATUS

(75) Inventors: Yeon-Ha Cho; Seok-Ho Go, both of Suwon; Joon-Ho Lee, Sungnam-shi; Jae-Im Yun, Suwon, all of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/250,425

(22) Filed: Feb. 16, 1999

(51) Int. Cl.[7] .............................. H01J 37/08; H01J 37/30
(52) U.S. Cl. ........................ 250/492.21; 250/397
(58) Field of Search ............................. 250/452.21, 397

(56) References Cited

U.S. PATENT DOCUMENTS

| | | | | |
|---|---|---|---|---|
| 4,849,641 | * | 7/1989 | Berkowitz | 250/397 |
| 5,319,212 | * | 6/1994 | Tokoro | 250/397 |
| 5,468,966 | * | 11/1995 | Elmer et al. | 250/397 |
| 5,554,926 | * | 9/1996 | Elmer et al. | 250/397 |
| 5,760,409 | * | 6/1998 | Chen et al. | 250/492.21 |
| 5,977,553 | * | 11/1999 | Oh et al. | 250/492.21 |
| 5,998,798 | * | 12/1999 | Halling et al. | 250/492.21 |
| 6,020,592 | * | 2/2000 | Liebert et al. | 250/492.21 |
| 6,031,240 | * | 2/2000 | Kodama | 250/492.21 |

FOREIGN PATENT DOCUMENTS

| | | | |
|---|---|---|---|
| 402051837A | * | 2/1990 | (JP) . |
| 04132151A | * | 5/1992 | (JP) . |
| 08096743A | * | 4/1996 | (JP) . |
| 0200012377A | * | 4/2000 | (JP) . |

* cited by examiner

Primary Examiner—Bruce C. Anderson
(74) Attorney, Agent, or Firm—Skjerven Morrill MacPherson LLP; David W. Heid

(57) ABSTRACT

An ion implantation apparatus for use in manufacturing semiconductors includes a loopback device connected to a bias ring for a Faraday cup. The loopback device detects whether a current flows through the bias ring and generates an interlock signal to be supplied through an interface to a controller. In response to the interlock signal, the controller stops an implantation operation of the apparatus, and a driver circuit drives a warning device in response to the interlock signal.

16 Claims, 4 Drawing Sheets

METHOD FOR MONITORING FARADAY CUP OPERATION IN AN ION IMPLANTATION APPARATUS

FIELD OF THE INVENTION

The present invention relates to an ion implantation apparatus for use in manufacturing semiconductors, and more particularly to a method of monitoring operation of Faraday cups in an ion implantation apparatus.

BACKGROUND OF THE INVENTION

An ion implantation apparatus used in manufacturing semiconductors implant impurities in targets such as silicon or gallium arsenide substrates. Such ion implantation apparatuses extract an ion beam from an ion source, accelerate the ion beam to a desired implantation energy, and direct the ion beam at a target to implant the ions in the target. The concentration of the impurity being introduced into the target can be established by measuring the current of the ion beam using a Faraday cup and integrating the current over time to determine the dose. For current integrated circuit manufacturing processes, high energy implant processes that can freely control impurity profile in the interior of silicon substrates are increasingly important. To achieve high energy implants, implantation apparatuses commonly use tandem acceleration principles for accelerating ions to high energy and implanting them in silicon substrates. Tandem acceleration principles are well known and are described in U.S. Pat. No. 3,353,107, which is hereby incorporated herein its entirety. Tandem acceleration techniques produce a negative ion beam by combining a positive ion source and a charge exchange cell, or by using a sputter type negative ion source. The negative ion beam is directed toward an accelerator terminal that is at high positive voltage and accelerated to the terminal voltage. Electrons are then stripped from this accelerated negative ion beam by passing the beam through a gas or thin foil, to convert the beam into a positive ion beam. The positive ion beam is accelerated again to ground potential from the accelerator terminal maintained at high positive potential and acquires its final energy.

An example of an actual apparatus that uses this tandem principle is a Genus Inc. Model G1500 high energy ion implantation apparatus. FIG. 1 shows the model G1500 modified by omitting a pre-acceleration tube. U.S. Pat. No. 4,980,556 further describes such ion implantation devices and is hereby incorporated by reference herein in its entirety. In this apparatus, a hot-cathode PIG (Penning Ion Gauge) ion source 1 produces positive ions that are extracted as a beam by impressing a high positive voltage on ion source 1. The extracted positive ion beam collides with magnesium vapor when passing through a charge exchange cell 2 which is adjacent the extraction electrode system. In the collisions, some of the positive ions in the positive ion beam pick up two electrons from the magnesium vapor and are converted to negative ions.

After passing through the charge exchange cell 2, a 90-degree analyzing magnet 3 analyzes the beam according to the charge-to-mass ratio of the ions so that only the desired negative ions are injected into a tandem accelerator 5. A quadrapole magnetic lens (Q-lens) 4 at the entrance aperture part of the low-energy acceleration tube 6 of the tandem accelerator 5 receives the mass-analyzed negative ion beam and focuses the beam to create a beam waist at the center of a stripper canal 7 which is in tandem accelerator 5. At the same time, a high positive voltage accelerates the negative ion beam towards stripper canal 7.

When this accelerated negative ion beam passes through the stripper canal 7, ions lose orbital electrons in collisions with nitrogen gas in stripper canal 7 and are converted again into positive ions. At this time, the energy of the collisions determines the distribution of charge states of the ions in the beam. In particular, higher energy collisions produce more multi-charged ions. The positive ion beam thus obtained is directed towards ground potential from the tandem accelerator terminal, and further accelerates while passing through a high-energy acceleration tube 8.

The beam thus having its final energy receives further focusing by a quadrapole lens 9. An analyzing magnet 10 selects ions having the desired charge state and directs the selected ions into a process chamber 11 containing a target (for example, wafer or substrate).

The ion implantation apparatus of FIG. 1 generally includes two Faraday cups (or cages). The first Faraday cup is between analyzing magnet 3 and Q-lens 4 and measures the beam current for set up the beam. The second Faraday cup is within the process chamber 11 and measures the implant dose by measuring the beam current. Hereinafter, the first Faraday cup is called the "injector Faraday cup" and the second Faraday cup is called "disk Faraday cup".

FIG. 2 illustrates a beam current 21 striking a disk 23 at a radius 24. Disk 23 holds a wafer 25 and rotates to scan beam 21 across wafer 25. Disk also moves up and down to change the radius at which beam 21 crosses wafer 25. A disk Faraday cup 22, which is behind disk 23, samples beam current 21 each time disk 23 rotates so that beam current 21 passes through a gap in disk 23. At the end of a scan across wafer 25, beam 21 is at radius 27 and no longer impacting upon wafer 25, and injector Faraday cup 26, which is upstream of spinning disk 23, moves in position to measure the upstream current.

In the above-described ion implantation apparatus, the injector and disk Faraday cups have bias rings that are electrically connected in series. The bias rings have a bias voltage that suppresses capture of electrons by the respective Faraday cups. Capture of electrons can lead to errors in measurement of the current and the implantation dose, resulting in failure of an integrated circuit being manufactured. However, the known ion implantation apparatus is unable to monitor whether both bias rings are appropriately biased.

SUMMARY OF THE INVENTION

An embodiment of the present invention provides an ion implantation apparatus that monitors the operation of Faraday cups to prevent an ion overdose or underdose. The apparatus includes a controller for controlling overall functions of the apparatus and generating an optical power control signal, a first Faraday cup for optimally setting up a beam current, a second Faraday cup for measuring an implant dose, an interface for converting the optical power control signal into an electrical power control signal, and a Faraday bias circuit for generating a bias voltage to be supplied to the first Faraday cup in response to the electrical power control signal. The first Faraday cup has a first bias ring for receiving a bias voltage, and the second Faraday cup has a second bias ring electrically connected to the first bias ring. The bias voltage suppresses capture of secondary electrons. The apparatus further includes a loopback device in communication with the second bias ring. The loopback device detects whether a current flows through the second bias ring, and if the current does not flow properly, generates an interlock signal to the controller. At the same time, a driver circuit activates an alarm in response to the interlock signal, and stops the apparatus' operation.

According to another aspect of the invention, a method for monitoring operation of a Faraday cup positioned in an ion implantation apparatus includes providing a bias voltage to a bias ring of the Faraday cup, detecting whether a current flows through the bias ring, generating an interlock signal to a controller of the apparatus if the current does not flow properly, and stopping operation of the apparatus in response to the interlock signal.

BRIEF DESCRIPTION OF THE DRAWINGS

The scope and contents of the invention will become more apparent with reference to the accompanying drawings, in which.

Use of the same reference symbols in different figures indicates similar or identical items.

DETAILED DESCRIPTION OF PREFERRED EMBODIMENTS

The present invention is described with reference to sample preferred embodiments, but it must be recognized that the present invention can be widely modified and varied, and the scope of the present invention is not limited except as set forth in the accompanying claims.

Figure 1:
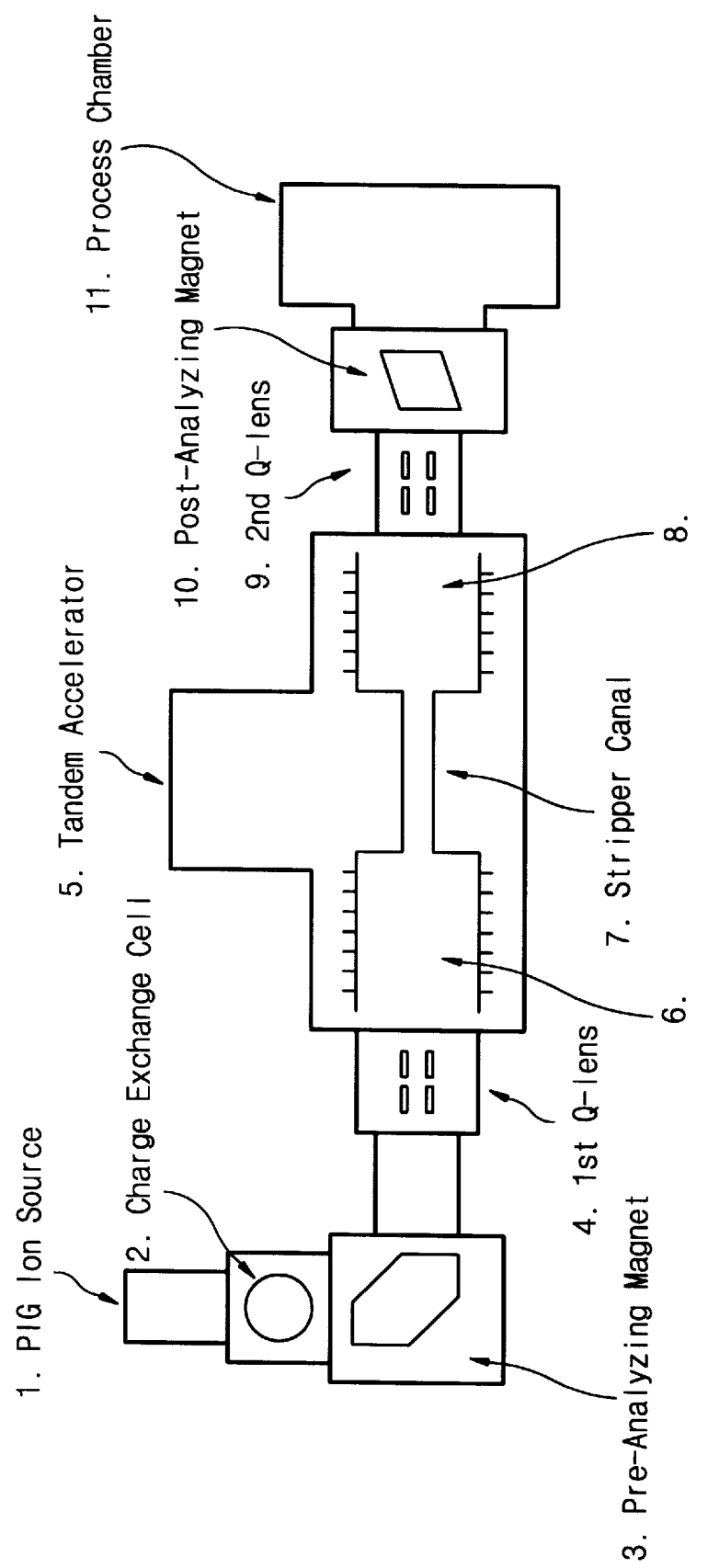
FIG. 1 illustrates a known ion implantation apparatus.
Figure 2:
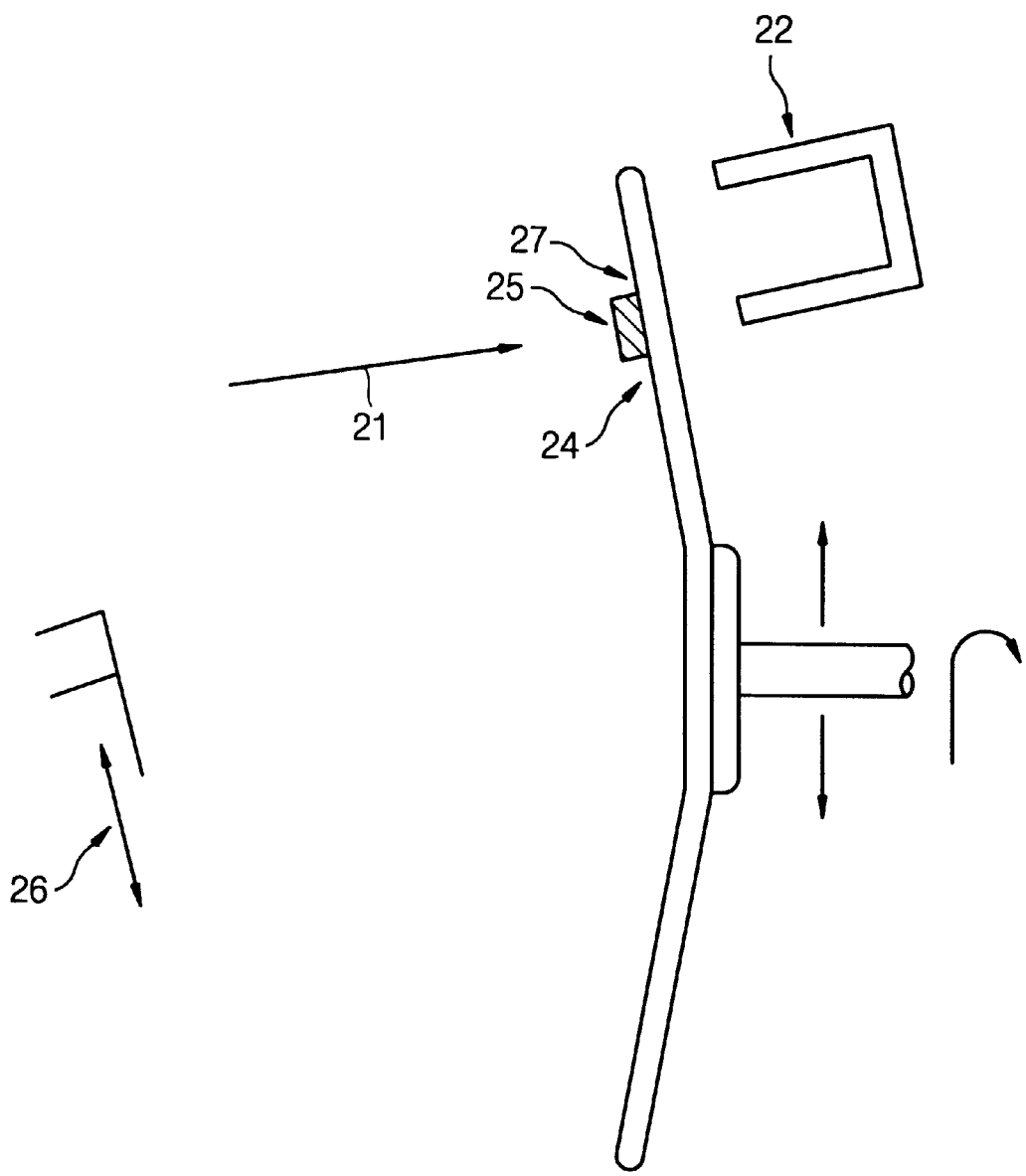
FIG. 2 shows a spinning disk and a Faraday cup in the apparatus of FIG. 1.
Figure 3:
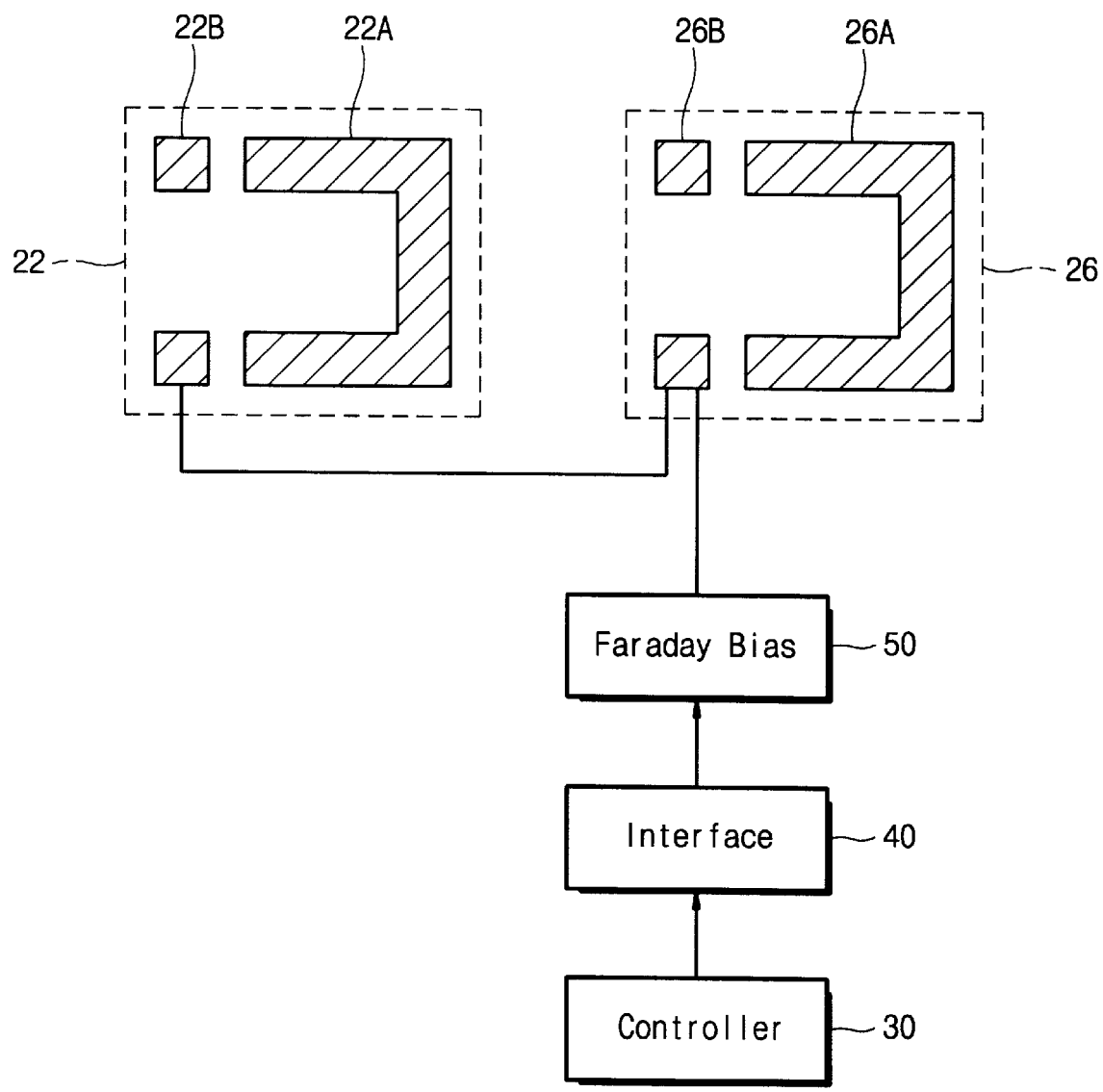
FIG. 3 is a block diagram of a known system for operating bias rings in Faraday cups.

FIG. 3 illustrates operation of an injection Faraday cups 22 and a ring Faraday cup 26 of an ion implantation apparatus. Each Faraday cup 22 or 26 includes a bias ring 22B or 26B and a collection cup 22A or 26A. The disk and injector bias rings 22B and 26B are electrically connected in series with bias ring 26B being connected to a bias circuit 50. Bias rings 22B and 26B are positioned and biased to suppress collection of secondary electrons in cups 22A and 26A. In particular, bias ring 22B, which is between cup 22A and disk (not shown), receives a negative bias of, for example, several hundred volts, to suppress secondary electron emission that arises from an ion beam striking the disk. Collecting such electrons would give an incorrect reading of the ion current and a dose error could result.

Bias circuit 50 typically includes a power supply (not shown) for feeding the negative bias voltage to bias rings 26B and 22B. The power supply may be manually operated or operated in response to a power control signal via an interface 40 from a controller 30. Controller 30 has overall control of the ion implantation apparatus including measuring ion current and determining an implantation dose. Since the bias rings 22B and 26B are electrically connected in series, if no bias voltage is applied to the bias rings, Faraday cups 26 and 22 do not suppress the capture of electrons. This leads to a dose error, for example, an overdose or underdose of a target substrate or wafer. Such errors can result, for example, if the power supply of the Faraday bias is turned off. In such cases, bias circuit 50 applies no bias voltage to bias rings 26B and 22B even when controller 30 supplies a power control signal directing bias circuit to apply the bias voltage. Also, if the electrical connection between bias rings 26B and 22B is broken (i.e., open), or if electrical connection between bias circuit 50 and bias ring 26B is short-circuited, bias rings 22B and 26B will not be properly biased, and a dose error leading to integrated circuit failures may result. The system of FIG. 3 does not include means for monitoring bias rings 22B and 22A to determine whether both rings 22B and 26B are properly biased.

Figure 4:
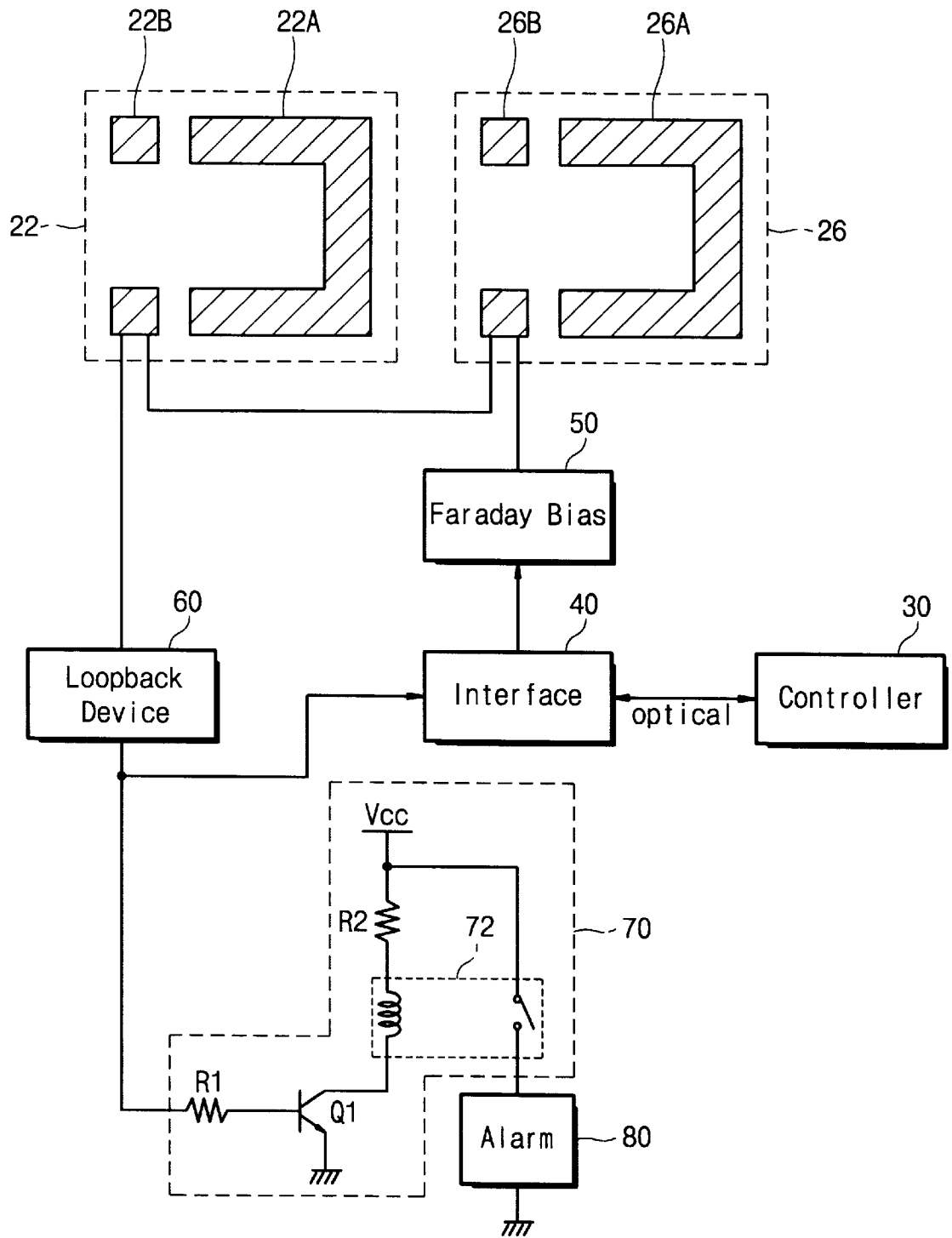
FIG. 4 is a schematic circuit diagram for monitoring operation of a Faraday cup in accordance with an embodiment of the present invention.

In accordance with an embodiment of the invention, FIG. 4 illustrates a system that monitors the bias voltage of bias rings 22B and 26B. The system of FIG. 4 monitors a current flowing through bias rings 22B and 26B from bias circuit 50 and generates an interlock signal when the expected current does not flow or when an overcurrent flows. If the interlock signal is generated during an implantation operation, the implantation operation is stopped, and a warning device such as a buzzer or a lamp is turned on.

In FIG. 4, bias circuit 50 feeds a negative bias of several hundred volts to the injector and disk bias rings 26B and 22B in response to the electrical power control signal. To generate the control signal to bias circuit 50, controller 30 sends an optical power control signal to interface 40 which converts the optical power control signal into the electrical power control signal. Optical couplings suitable for converting optical signals to electrical signals are well known and serve to isolate controller 30 from the high (negative) voltages generated in bias circuit 50. As described above, bias circuit 50 has a power supply that may be operated manually or in response to the electrical power control signal from interface 40, and controller 30 controls overall operation of the ion implantation apparatus.

In response to the control signal, bias circuit 50 applies the bias voltage through bias ring 26B to bias ring 22B. A current signal flows through bias rings 26B and 22B to a loopback device 60. Loopback device 60 generates an interlock signal whenever bias ring 22B is improperly biased, for example, when bias circuit 50 does not apply the bias voltage to bias ring 26B, or when the bias voltage from bias ring 26B does not reach bias ring 22B. Loopback device 60 supplies the interlock signal through interface 40 to controller 30 which responds by halting ion implantation. Loopback device 60 also supplies the interlock signal to a driver circuit 70 that turns on an alarm 80.

In one embodiment, loopback device 60 includes a resistor of known resistance connected between bias ring 22B and driver circuit 70 or interface 40. When the bias voltage is not applied to bias ring 26B, or is current flows through the resistor in loopback device 60. The voltage at the end of the resistor coupled to interface 40 and/or driver circuit 70 changes. The change in voltage causes interface 40 to send the interlock signal to controller 30 and causes driver circuit 70 to activate the alarm.

Alternatively, loopback device 60 includes a current meter and a microcomputer in which a control program runs. The current meter measures the current flowing to or from bias ring 22B and sends to the microcomputer a signal indicative of the measured current. The microcomputer receives the signal and determines the level of the measured current. If the detected current is beyond a normal range, the microcomputer generates the interlock signal. For example, when the measured current is too high or too low, the microcomputer generates the interlock signal to prevent the dose error, that is, an underdose or overdose of a target wafer.

In driver circuit 70, when the interlock signal is applied at low level through a resistor R1 to the base of an NPN transistor Q1, transistor Q1 turns off. Then a switch in a relay 72, which is connected to the emitter of the transistor Q1, connects a power voltage Vcc to alarm 80. As a result, alarm 80 turns on.

The system of FIG. 4 can thus monitor the accuracy of the implant dose by detecting whether bias rings 22B and 26B are properly biased and displaying and/or warning controller 30 or a system operator when the Faraday cups 22 and 26 are operating abnormally. Thereby, the dose errors can be prevented by stopping an implanting operation.

The monitoring method of the apparatus is thus achieved by providing the bias voltage to the bias rings, detecting whether a current flows through the injector and disk bias rings 26B and 22B and generating an interlock signal if the expected current does not flow. The interlock signal is supplied through interface 40 to controller 30, which halts an implantation operation of the apparatus in response to the interlock signal. This method, although shown for an ion implantation apparatus having two Faraday cups, is also applicable to apparatus having a single Faraday cup, for example, an implant dose measuring Faraday cup, or three or more Faraday cups having bias rings connected in series.

In addition, loopback device 60 may further comprise a display device, for example, a light emitting diode (LED) which turns on when no current flows through bias rings. When the interlock signal is generated, the implantation operation of the apparatus is stopped, and the LED device is turned on. At the same time, driver circuit 70 activates a warning device, such as a buzzer or a lamp, in response to the interlock signal.

As a further alternative, a loopback device can detect when a bias voltage is not applied to the bias ring for a beam current optimizing Faraday cup, or is applied to the bias ring for a beam current optimizing Faraday cup but not to the bias ring for an implant dose measuring Faraday cup. For the alternative embodiment, the bias circuit connects to the injector bias ring, and the loopback device connects to the disk bias ring. As above, the interlock signal causes activation of a warning device and at the same time stops an implantation operation of the apparatus.

Embodiments of the present invention are also described in a corresponding Korean Patent Application Ser. No. 1997-13648, which is hereby incorporated by reference herein in its entirety.

What is claimed is:

1. An apparatus for ion implantation in a target substrate, comprising:
   a control system that controls the apparatus and generates a control signal;
   a first Faraday cup having a first bias ring;
   a second Faraday cup having a second bias ring electrically connected to the first bias ring;
   a bias circuit that supplies a bias voltage to the first bias ring in response to the control signal; and
   a loopback device electrically connected to the second bias ring, the loopback device detecting whether a current from the second bias ring is within a proper range and generating, if necessary, an interlock signal to the control system, wherein the control system stops an implanting operation of the apparatus in response to the interlock signal.

2. The apparatus according to claim 1, further comprising a driver circuit connected to the loopback device, wherein the driver circuit generates an alarm when receiving the interlock signal from the loopback device.

3. The apparatus according to claim 1, wherein the loopback device is a resistor.

4. The apparatus according to claim 1, wherein the loopback device comprises a current meter for detecting the current from the second bias ring, and a microcomputer for determining level of the current.

5. The apparatus according to claim 1, wherein the second Faraday cup collects ions to measure an ion current when the ion beam impinges upon the target substrate.

6. The apparatus according to claim 5, wherein the second bias ring suppresses secondary electrons to prevent neutralizing of the ion beam.

7. The apparatus according to claim 1, wherein the control system comprises:
   a controller that controls overall functions of the apparatus and generates an optical control signal; and
   an interface that converts the optical control signal into the control signal to the bias circuit.

8. The apparatus according to claim 7, wherein the control signal to the bias circuit is an electrical power control signal.

9. An apparatus for use in manufacturing semiconductors, comprising:
   a controller for controlling overall functions of the apparatus and generating a first control signal;
   a Faraday cup for measuring an implant dose, the Faraday cup having a bias ring;
   an interface for converting the first control signal into a second control signal;
   a bias circuit for generating the bias voltage in response to the second control signal and supplying the bias voltage to the Faraday cup; and
   a loopback device electrically connected to the bias ring, the loopback device detecting whether a current from the bias ring is within a proper range and generating, if necessary, an interlock signal through the interface to the controller, wherein the controller stops an implanting operation of the apparatus in response to the interlock signal.

10. The apparatus according to claim 9, further comprising a driver circuit connected to the loopback device, wherein the driver circuit generates an alarm when receiving the interlock signal from the loopback device.

11. The ion implantation apparatus according to claim 9, wherein the loopback device comprises a current meter for detecting the current flowing from the bias ring, and a microcomputer for determining level of the current.

12. The apparatus according to claim 9, wherein the Faraday cup measure ion current when an ion beam for implantation impinges upon the target substrate.

13. The apparatus according to claim 12, wherein the bias ring suppresses secondary electrons so as not to neutralize the ion beam.

14. The apparatus according to claim 9, wherein the first control signal is an optical power control signal.

15. The apparatus according to claim 9, wherein the second control signal is an electrical power control signal.

16. A method for monitoring a Faraday cup having a bias ring of an ion implantation apparatus controlled by a controller in the apparatus, the method comprising:
   providing the bias voltage to the bias ring;
   detecting whether a current from the bias ring is within a proper range;
   generating an interlock signal to a controller if the current is not within the proper range; and
   stopping an implanting operation of the apparatus in response to the interlock signal by means of the controller.

* * * * *